(12) United States Patent
Phlippoteau et al.

(10) Patent No.: US 8,907,675 B2
(45) Date of Patent: Dec. 9, 2014

(54) METHOD FOR DETERMINING A STATE OF HEALTH FOR AN ELECTROCHEMICAL DEVICE

(75) Inventors: Vincent Phlippoteau, Aix en Provence (FR); André Rakotondrainibe, Aix-en-Provence (FR); Christophe Turpin, Toulouse (FR); Guillaume Fontes, Toulouse (FR)

(73) Assignees: Helion, Aix (FR); Institut National Polytechnique de Toulouse, Toulouse (FR); Centre National de la Recherche Scientifique, Paris (FR)

( * ) Notice: Subject to any disclaimer, the term of this patent is extended or adjusted under 35 U.S.C. 154(b) by 777 days.

(21) Appl. No.: 13/202,607

(22) PCT Filed: Feb. 22, 2010

(86) PCT No.: PCT/EP2010/052176
§ 371 (c)(1),
(2), (4) Date: Nov. 2, 2011

(87) PCT Pub. No.: WO2010/097355
PCT Pub. Date: Sep. 2, 2010

(65) Prior Publication Data
US 2012/0038452 A1    Feb. 16, 2012

(30) Foreign Application Priority Data
Feb. 24, 2009 (FR) .................................. 09 51168

(51) Int. Cl.
*G01N 27/416* (2006.01)
*G01R 31/36* (2006.01)
*H01M 8/04* (2006.01)

(52) U.S. Cl.
CPC ............ *G01R 31/3679* (2013.01); *Y02E 60/50* (2013.01); *H01M 8/04679* (2013.01)
USPC .......................................... 324/433; 324/432

(58) Field of Classification Search
CPC ............ H02J 7/35; H02J 7/355; Y02E 60/12; H01M 10/465; H01M 16/006
USPC ................................................... 324/433
See application file for complete search history.

(56) References Cited

U.S. PATENT DOCUMENTS 6,456,988 B1    9/2002   Singh et al.
(Continued)

FOREIGN PATENT DOCUMENTS

EP       1 923 945 A1    5/2008
WO       03/098769 A2   11/2003

OTHER PUBLICATIONS

Fontes: "Modelisation et acaracterisation de la pile PEM port l'erude des interactions avec les convertisseurs statiques" Sep. 16, 2005, Toulouse, XP002581575, pp. 1, 75-109.
(Continued)

*Primary Examiner* — Arun Williams
(74) *Attorney, Agent, or Firm* — Pearne & Gordon LLP

(57) ABSTRACT

The invention relates to a method for determining a state of health of an electrochemical device in particular having improved reliability. Said method in particular consists of:
  applying (10) to said electrochemical device an input signal comprising electrical excitations of different categories, and measuring an output signal (20) including the response signals to each electrical excitation;
  estimating (41) at least one first parameter from an electrical excitation belonging to a first category and the corresponding response signal;
  estimating (43) said at least one physicochemical parameter representative of the physicochemical behavior of the device from an electrical excitation of a different category, of the corresponding response signal and said first estimated parameter;
  estimating (50) said state of health of the electrochemical device as deviation between the previously estimated value of the physicochemical parameter and a reference value.

20 Claims, 8 Drawing Sheets

(56) References Cited

U.S. PATENT DOCUMENTS

| | | |
|---|---|---|
| 6,518,735 B2 * | 2/2003 | Kawaguchi et al. .......... 324/430 |
| 2002/0070706 A1 * | 6/2002 | Champlin ..................... 320/132 |
| 2003/0061182 A1 * | 3/2003 | Singh et al. ....................... 706/2 |
| 2006/0078788 A1 | 4/2006 | Ramschak |
| 2006/0170397 A1 | 8/2006 | Srinivasan et al. |
| 2008/0091367 A1 | 4/2008 | Rea et al. |

OTHER PUBLICATIONS

Andreaus et al; "Proton-conducting polymer membranes in fuel cells-humidification aspects", Solid State Ionics, vol. 168, No. 3-4, Mar. 31, 2004, pp. 311-320 XP004507529, ISSN: 0167-2738.

Yuan et al; "AC impedance technique in PEM fuel cell diagnosis—A review", International Journal of Hydrogen Energy, vol. 32, No. 17. Nov. 29, 2007, pp. 4365-4380, XP022369437, ISSN: 0360-3199.

Fouquet et al; "Model based PEM fuel cell state-of-health monitoring via ac impedance measurements", Journal of Power Sources, vol. 159, No. 2, Sep. 22, 2006, pp. 905-913, XP025084267, ISSN: 0378-7753.

Cho et al; "Transient response of a unit proton-exchange membrane fuel cell under various operating conditions", Journal of Power Sources, vol. 185, No. 1, Oct. 15, 2008, pp. 118-128, XP025399270.

International Search Report for PCT/EP2010/052176 dated May 26, 2010.

Fontes: Modilisation et acaraterisation de la pile PEM pour l'etude des interactions avec les convertisseurs statiques, Sep. 16, 2005, pp. 1, 75-109, XP 002581575 Cited in the International Search Report.

Andreaus et al; "Proton-conducting polymer membranes in fuel cells-humidification aspects", Solid State Ionics, North Holland Pub. Company. DOI: 10.1016/J.SSI.2003.01.001, vol. 168, No. 3-4, Mar. 31, 2004 pp. 311-320, XP004507529 ISSN: 0167-2738 Cited in the International Search Report.

Yuan et al; "AC impedance technique in PEM fuell cell diagnosis—A review" International Journal of Hydrogen Energy Elsevier Science Publishers B.V. DOI: 10.1016/J.IHYDENE.2007.05.036, vol. 32, No. 17, Nov. 29, 2007 pp. 4365-4380, XP022369437, ISSN: 0360-3199 Cited in the International Search Report.

Fouquet et al; "model Based PEM fuel cell state-of-health monitoring via ac impedance measurements", Journal of Power Sources, Esevier SA, CH, vol. 159, No. 2, Sep. 22, 2006 pp. 905-913, XP025084267, ISSN: 0378-7753 Cited in the International Search Report and French Search Report.

Cho et al; "Transient response of a unit proton-exchange membrane fuel cell under various operating conditions" Journal of Power Sources, Elsevier SA, CH, vol. 185, No. 1, Oct. 15, 2008, pp. 118-128, XP025399270, ISSN: 0378-7753 Cited in the International Search Report and French Search Report.

French Search Report for FR 09 51168 dated Dec. 17, 2009.

* cited by examiner

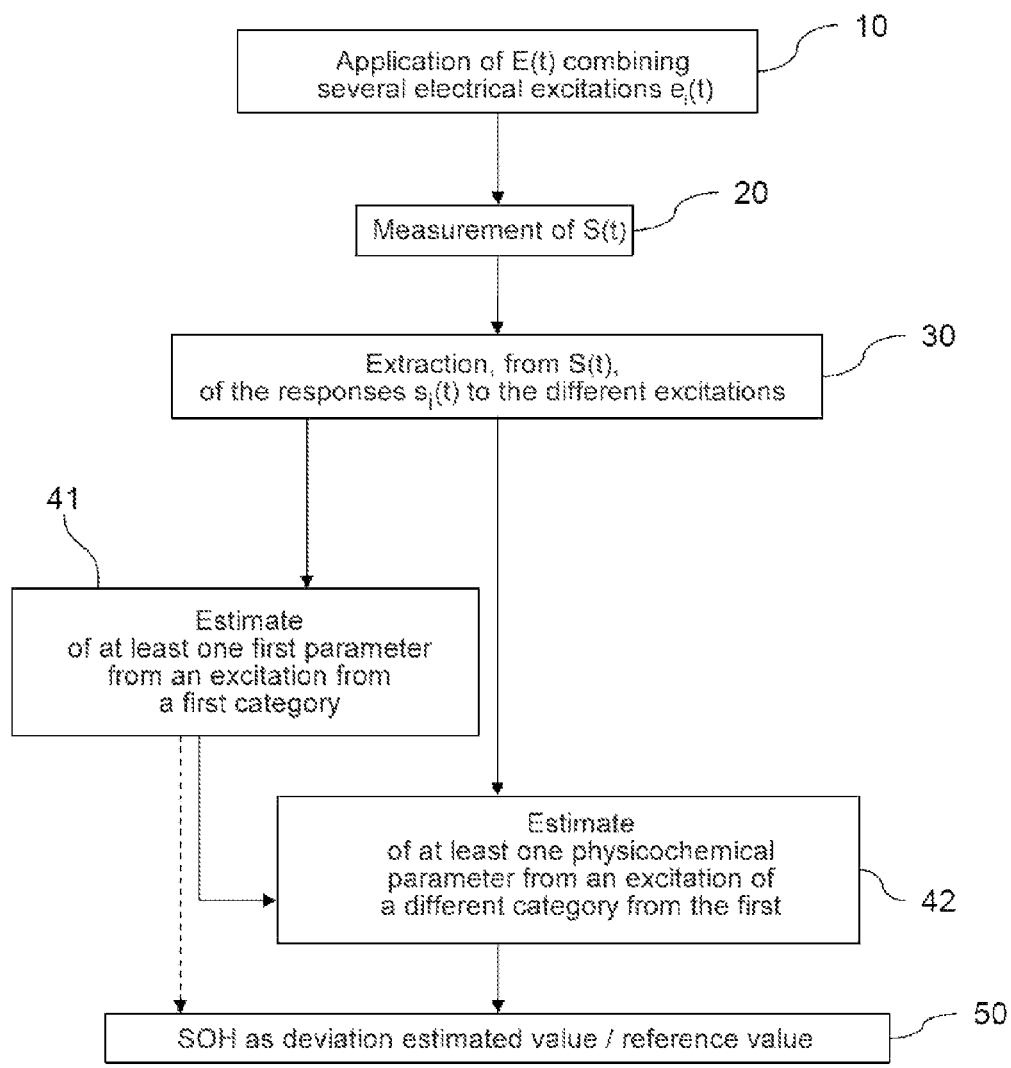

METHOD FOR DETERMINING A STATE OF HEALTH FOR AN ELECTROCHEMICAL DEVICE

TECHNICAL FIELD

The present invention relates to the general field of electrochemical devices, and more specifically relates to a method for determining, or diagnosing, a state of health of said electrochemical device.

The electrochemical device can be a fuel cell, an electrolyzer, a primary or rechargeable battery, or any other type of electrochemical device.

BACKGROUND OF THE INVENTION

In general, throughout the life cycle of an electrochemical device, its performance tends to gradually deteriorate. This can come from irreversible physicochemical changes that take place mainly during the operation of the device, but also when the device is stopped.

It can then be essential to have information on the state of general deterioration of the device, to thereby know how far it has advanced its life cycle.

Moreover, during operation of an electrochemical device, certain physical phenomena can take place that cause a sudden drop in performance. For example, in the case of fuel cells of the proton exchange membrane type, the engorgement and drainage phenomena cause substantial deterioration of the cell's performance.

It is therefore desirable to be able to detect these phenomena in real time to resolve them rapidly.

Determining the overall deterioration of the state of the device, as well as detecting certain harmful phenomena, amounts to determining a state of health of the electrochemical device.

The state of health of the electrochemical device can be defined as a deviation between the estimated or measured value of at least one physicochemical parameter at least partially modeling the physicochemical behavior of the electrochemical device, and a predetermined reference value of the same parameter. This deviation translates the operational nature of the device both in the long term (remaining lifetime) and short term (appearance of physical phenomena that abruptly decrease the performance). Of course, it may involve a relative or absolute deviation.

Of course, the notion of state of health covers various realities, which depend on information that the user wishes to obtain.

In general, a state of health may be determined from a set of characteristic parameters providing information on the static and/or dynamic behavior of said electrochemical device. These parameters can represent the different physicochemical phenomena coming into play within the electrochemical device, such as, for example, phenomena related to the chemical kinetics, ohmic phenomena, and, in the case of a fuel cell, diffusion phenomena of reactive fluids to the reaction sites.

As an example, determining a state of health of a fuel cell of the proton exchange membrane (PEM) type can comprise a real-time estimate of certain parameters such as the internal electrical resistance (generally likened to the electrical resistance of the membrane) of the cell, the moisture content of the membrane, or parameters relative to the diffusion phenomena or phenomena related to the chemical kinetics, with the aim of monitoring its state of general deterioration on the one hand, and detecting a drainage phenomenon of the membrane on the other hand. Thus, it is possible to react more quickly to prevent this type of phenomenon from lasting and irreversibly damaging the cell.

Several parameters estimating methods, for determining a state of health of the device, are commonly used in the context of PEM-type fuel cells.

In general, each of the methods usually comprises a first step of obtaining experimental data and a second step for exploiting measurements to estimate one or more characteristic parameters.

The first step consists of applying a particular electric excitation to the electrochemical device and measuring the electrical response thereof.

The second step is the analysis of the input and output signals to estimate one or more parameters at least partially characterizing the behavior of the cell. These parameters can belong to a static and/or dynamic model representing the global or partial behavior of the cell.

Lastly, a state of health of the cell is estimated as the deviation between the estimated value of the parameter(s) with a predetermined reference value with the same parameter(s).

A first method is based on the known electrochemical impedance spectroscopy technique. It can be used to detect the engorgement or drainage of a fuel cell, as described in the article by Fouquet et al. entitled "Model based PEM fuel cell state-of-health monitoring via ac impedance measurements" and published in 2006 in the Journal of Power Sources, 159, 905-913.

An input current is applied to the cell, which has a sequence of low-amplitude sinusoidal perturbations scanning a large range of frequencies. The voltage in response to these perturbations is measured at the terminals of the cell. It is then possible to obtain the impedance of the cell using an impedance analysis device. This impedance can be traced in the Nyquist plane, which gives the evolution of the imaginary part of the impedance as a function of its real part.

Then, the value of parameters of a model of said impedance (small signal dynamic model), of the equivalent electrical cell type, is estimated from signals measured using an optimization method, for example the method of least squares. The impedance model can be the following equivalent electrical circuit:

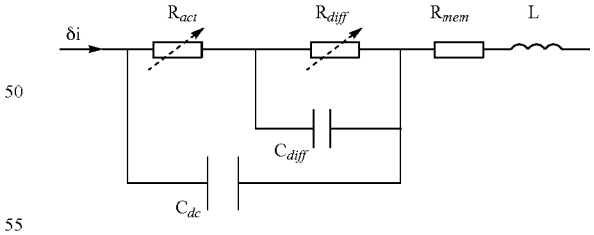

where $R_{mem}$, $R_{diff}$, $R_{act}$ are respectively the resistances of the membrane, for diffusion and activation, and $C_{dc}$ and $C_{diff}$ are respectively the double layer capacity and the capacity of the equivalent diffusion layer. A description of the use of this type of model can be found in the thesis by Fontès entitled "Modélisation et caractérisation de la pile PEM pour l'étude des interactions avec les convertisseurs statiques," 2005, Institut National Polytechnique de Toulouse, in section 3.4.3 "Exploitation of impedance diagrams."

The estimated value of one or more parameters of the model is then compared to a predetermined reference value of the same parameter(s). The deviation between the estimated value and the reference value characterizes the state of health of the cell.

A second estimating method, also known by those skilled in the art, is based on the study of the voltage response of the electrochemical device upon application of a current step such as, for example, a current interruption.

This method is in particular described in the article by Cho et al. entitled "Transient response of a unit proton-exchange membrane fuel cell under various operating conditions" and published in 2008 in the Journal of Power Sources 185, 118-128.

From measurements of the applied current and the voltage response, it is possible to deduce the internal electrical resistance of the device simply.

One then calculates a deviation by comparing the value deduced from the internal electrical resistance at a predetermined reference value, said deviation characterizing the state of health of the cell.

A third method, called high-amplitude scanning, is described in the aforementioned thesis by Fontès.

It consists of applying, to the electrochemical device, a periodic input current, preferably low frequency, and an amplitude corresponding to a current range going substantially from zero to the nominal current, and measuring the response voltage. Inasmuch as the scanning frequency is very low, the current/voltage polarization curve is drawn automatically.

Then, the parameters of a static or dynamic model, depending on the frequency of the scanning, of the electrochemical device describing the evolution of the voltage as a function of the applied current are estimated using experimental values, for example using an optimization method of the least squares type.

As an illustration, as shown by the Fontès 2005 thesis in section 3.4.1 entitled "Static exploitation of voltage-current curves" regarding a PEM-type fuel cell, the experimental polarization curve $U_{cellule}=f(I)$, at a constant temperature and pressure, can be compared to the following static four-variable model:

$$U_{cellule} = E_{th} - \frac{R \cdot T}{\alpha^* \cdot n \cdot F} \ln\left(\frac{I}{I_0^*}\right) - (R_{diff,0} + R_{mem}) \cdot I$$

where $\alpha^*$ and $I^*_0$ are parameters relative to the activation over-voltages, $R_{mem}$ is the electrical resistance of the cell due primarily to the ohmic losses in the membrane, and $R_{diff,0}$ is a resistance related to losses by diffusion, and in particular to diffusion over-voltages. As indicated above, the different parameters of the model can be estimated using an optimization method of the least squares type.

As before, one then calculates a deviation by comparing the estimated value of one or more parameters of the static model to a predetermined reference value of the same parameter(s), said deviation characterizing the state of health of the cell.

However, the operation time and/or quality of the results of each of these different methods can prove unsatisfactory. The performance time of a method designates, here and in the rest of the document, the time to obtain experimental data and process it to obtain the parameters. The quality of the results, here and in the rest of the document, designates, on the one hand, the coherence of the parameters obtained with the known and expected orders of magnitude, and on the other hand, the precision in terms of possible intervals of values for each of these parameters (ideally this interval is reduced to a single value for each parameter).

Furthermore, each method can only provide limited information in terms of accessible parameters, which can be insufficient to determine an actual state of health of the studied electrochemical device. One solution could consist of applying these different methods successively, but the processing time would be prohibitive, without, furthermore, improving the robustness of each method.

BRIEF DESCRIPTION OF THE INVENTION

The aim of the present invention is to propose a method for determining a state of health of an electrochemical device making it possible to at least partially resolve the drawbacks of the prior art methods.

As before, the state of health of the electrochemical device here is defined as the deviation between the estimated or measured value of at least one physicochemical parameter at least partially modeling the physicochemical behavior of the electrochemical device, on the one hand, and a predetermined reference value of the same parameter on the other hand.

To that end, the invention relates to a method for determining a state of health of an electrochemical device from at least one physicochemical parameter at least partially modeling the physicochemical behavior of said electrochemical device.

According to the invention, said method includes the following steps:

applying to said electrochemical device an input signal comprising a plurality of electrical excitations, each excitation belonging to a particular excitation category chosen from amongst a set formed by a sequence of sinusoidal current or voltage perturbations, around a polarization point of said electrochemical device, each perturbation having a different frequency, so as to travel through a particular series of frequencies; a current or voltage step; and a current or voltage variation going from zero to a nominal value, said input signal comprising at least two excitations of different categories, and measuring an output signal of said electrochemical device in response to said input signal; then extracting, from said output signal, the response signals associated with each of said electrical excitation signals; then estimating at least one first parameter from an electrical excitation belonging to a first category and the corresponding response signal;

estimating said at least one physicochemical parameter from an electrical excitation belonging to a category different from the first, of the corresponding response signal and at least the first estimated parameter;

estimating said state of health of the electrochemical device as deviation between the previously estimated value of said at least one physicochemical parameter and a predetermined reference value.

Physicochemical parameter refers to a parameter at least partially modeling the physicochemical behavior of the electrochemical device. The physicochemical parameter can be a parameter related to the activation or diffusion phenomena that may be present in the device. It can also be an electrical parameter such as, for example, the internal electrical resistance of the device, the impedance or admittance thereof.

Said electrical excitations comprised in the input signal are intended to make it possible to obtain a characterization of said electrochemical device, i.e. to estimate at least one of said electrical parameters defining it.

The method according to the invention thus has an increased quality of the results, in terms of precision and coherence, relative to the estimating methods of the prior art.

In fact, the estimation of the later parameter(s) is obtained, according to the invention, in particular from said first parameter(s) previously estimated. Thus, the information used to estimate the later parameter(s) is richer and thus makes it possible to obtain a better quality result, i.e. that is more coherent and more precise. The method is therefore more reliable.

Furthermore, the inventive method has a significant speed of execution inasmuch as the input signal comprises the different electrical excitations necessary for the subsequent determination of the state of health.

The method therefore has a particularly fast performance time for a significant reliability.

Advantageously, said first category electrical excitation and said electrical excitation of a category different from the first category are applied sequentially.

Advantageously, at least one first category electrical excitation is at least partially temporally superimposed on an electrical excitation of a category different from the first category. Thus, the input signal comprises maximum electrical excitations in a same period of time. The execution time of said method is then particularly decreased.

Preferably, the first category electrical excitation is a current or voltage step, and the electrical excitation of a category different from the first category is chosen from amongst a set formed by a sequence of sinusoidal current or voltage perturbations, around a polarization point of said electrochemical device, each perturbation having a different frequency, so as to travel through a particular series of frequencies, and a current or voltage variation going from zero to a nominal value.

Alternatively, the first category electrical excitation is a series of sinusoidal current or voltage perturbations, around a polarization point of said electrochemical device, each perturbation having a different frequency, so as to travel through a particular series of frequencies, and said electrical excitation of a category different from the first category is a current or voltage variation going from zero to a nominal value.

Advantageously, one estimates said state of health, moreover, as the deviation between the estimated value of said at least one first parameter and a predetermined reference value.

According to one embodiment of the invention, said input signal comprises at least three excitations of different categories. Before the step for estimating said at least one physicochemical parameter, one estimates at least one second parameter from an electrical excitation belonging to a second category different from the first category, of the corresponding response signal. The estimation of said at least one physicochemical parameter is done from an electrical excitation belonging to a third category different from the first category and the second category, of the corresponding response signal and said at least one first parameter and said at least one second parameter previously estimated.

Thus, said at least one physicochemical parameter is estimated with increased reliability, since at least one first parameter and at least one second parameter are used in this estimating step. As a result, the determination of the state of health, here from said at least one physicochemical parameter, benefits from this increased reliability.

Preferably, said at least one second parameter is estimated, moreover, from said at least one first parameter. Thus, said at least one second parameter is estimated with an increased reliability, since at least one first parameter is used in this estimating step. Of course, the estimate of said at least one physicochemical parameter is then more precise and more coherent, since it uses the estimation, which itself is more precise and more coherent, of the second parameter.

In the case of at least three categories of excitation, preferably, the first category electrical excitation is a current or voltage step, the second category electrical excitation is a sequence of sinusoidal current or voltage perturbations, around a polarization point of said electrochemical device, each perturbation having a different frequency, so as to travel through a particular series of frequencies, and the third category electrical excitation is a current or voltage variation going from zero to a nominal value.

Advantageously, one estimates said state of health as, moreover, the deviation between the estimated value of said at least one first parameter and a predetermined reference value, and/or as the deviation between the estimated value of said at least one second parameter and a predetermined reference value.

In the case where the input signal comprises an electrical excitation whereof the category is a sequence of perturbations, it is advantageously applied so as to scan, turn by turn, a plurality of sub-series of frequencies resulting from said primary series, each sub-series of said plurality being interlaced with at least one other sub-series of the same plurality.

The interlacing of the sub-series amounts to going back and forth in the scanning of the frequencies. As a result, during scanning of the frequencies in the primary series, soliciting the high frequencies again makes it possible to detect rapid physical phenomena. Likewise, again soliciting the low frequencies makes it possible to detect identifiable physical phenomena with long times. Thus, all throughout the measurement, it is possible to identify slow or fast physical phenomena.

Preferably, at least one frequency of a first sub-series is situated between two consecutive frequencies of a second sub-series with which the first sub-series is interlaced.

Each sub-series of said plurality can alternatively be interlaced with all of the other sub-series of the same plurality.

The perturbations of said sequence can be applied so as to monotonously or randomly scan the frequencies of each sub-series.

Furthermore, the perturbations of said sequence can be applied so as to scan, monotonously or randomly, said sub-series of said plurality, the sub-series being ranked according to a predetermined order.

The sub-series can be ordered according to an increasing or decreasing ranking of the maximum frequency of each sub-series. Alternatively, the order of the sub-series can depend on the minimum frequency of each sub-series.

In general, the estimation of a parameter from a current or voltage step, and of the corresponding response signal, advantageously consists of:

subtracting, from said input signal and said corresponding response signal, their respective value preceding the application of said electrical excitation, to thus obtain the current variation and the voltage variation;

calculating the instantaneous impedance by dividing said voltage variation by said current variation, and detecting a moment $t_1$, greater than the moment $t_0$ of application of said electrical excitation, for which said instantaneous impedance has a minimum;

extrapolating said instantaneous impedance from the moment $t_1$, and projecting said extrapolation to moment $t_0$, to thereby deduce the value of the internal electrical resistance of said electrochemical device.

Advantageously, an experimental evolution of the voltage as a function of the current being obtained from said input signal and said corresponding response signal, a model evolution of the voltage as a function of the current being parameterized by at least one of said parameters, the estimation of said parameter from a current or voltage variation going from zero to a nominal value is obtained by:

minimizing a characteristic size of the deviation existing between, on the one hand, said model evolution of the voltage and its N successive derivatives, and on the other hand, said experimental evolution of the voltage and its N successive derivatives.

Said electrochemical device can be an electrolyzer or a fuel cell.

The invention also relates to a method for controlling an electrochemical device including:

determining a state of health according to any one of the preceding characteristics; then measuring a deviation between said determined state of health and a reference state of health; then applying a command to said electrochemical device when said measured deviation exceeds a predetermined threshold deviation.

Other advantages and features of the invention will appear in the detailed non-limiting description below.

BRIEF DESCRIPTION OF THE FIGURES

We will now describe, as non-limiting examples, embodiments of the invention, in reference to the appended drawings, in which:

FIG. 1 is a flowchart of the diagnostic method according to a first preferred embodiment of the invention, in which two steps for estimating parameters are carried out successively;

DETAILED DESCRIPTION OF THE INVENTION

Figure 2A:
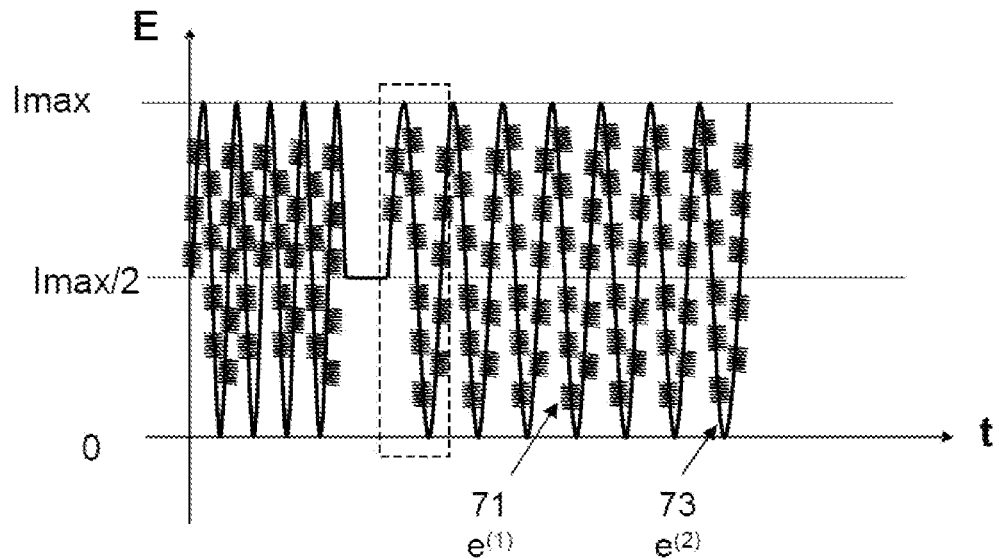
FIG. 2A is an example of an input signal comprising said first category and second category excitations, according to the first preferred embodiment of the invention.

In the rest of the description, the electrical system is a fuel cell of the proton exchange membrane type.

The electrochemical device is not, however, limited to a fuel cell, but can be an electrolyzer, a primary or rechargeable battery, or any other type of electrochemical device.

The fuel cell is connected to a power device making it possible to impose an electrical current, such as an active load or a static converter, as interface with an application.

The power device can be steered by a "signal"-type input allowing it to impose a steering order.

A measuring device is connected to the terminals of the fuel cell to measure the voltage. Preferably, the measuring device also performs the measurement of the current actually applied to the cell. The measuring device also makes it possible to acquire the measured signals.

According to a first preferred embodiment of the invention as shown in FIG. 1, the input signal comprises a plurality of electrical excitations, each excitation belonging to a particular category of excitations, said input signal here comprising two excitations of different categories.

For the rest of the description, E(t) defines the input signal and $e_i^{(1)}(t)$ defines the first category electrical excitations, where $i \in [1, N^{(1)}]$ and $N^{(1)}$, greater than or equal to 1, is the number of electrical excitations of that category; $e_j^{(2)}(t)$ the second category electrical excitations, where $j \in [1, N^{(2)}]$ and $N^{(2)}$, greater than or equal to 1, is the number of electrical excitations of that category; and $e_k^{(3)}(t)$ the third category electrical excitations, where $k \in [1, N^{(3)}]$ and $N^{(3)}$, greater than or equal to 1, is the number of electrical excitations of said category.

S(t) also denotes the output signal and $s_i^{(1)}(t)$ the response signals to the first category electrical excitations; $s_j^{(2)}(t)$ the response signals to the second category electrical excitations; and $s_k^{(3)}(t)$ the response signals to the third categories electrical excitations.

Thus, in the first preferred embodiment, the input signal E(t), here the electrical current, comprises $N^{(1)}$ excitations $e^{(1)}(t)$ and $N^{(2)}$ excitations $e^{(2)}(t)$, $N^{(1)}$ and $N^{(2)}$ are, indifferently of one another, greater than or equal to 1.

According to the first preferred embodiment, a first category electrical excitation is a sequence of sinusoidal current perturbations 71, around a polarization point of said electrochemical device, each perturbation having a different frequency, so as to travel through a particular series of frequencies.

The amplitude of the perturbations 71 is low enough for the response of the cell to remain linear. To that end, the amplitude is substantially less than 10% of the value of the current at the considered operating point, and is preferably in the vicinity of a percent of said value.

Each perturbation 71 has a different frequency, and the sequence of perturbations travels through a particular series of frequencies going from the high frequencies to the low frequencies, or vice versa. This series of frequencies can be traveled through monotonously, but can also be traveled through in different ways, as will be described later.

The series of frequencies can go from several millihertz to several tens of kilohertz.

According to the first preferred embodiment, a second category electrical excitation is a current variation 73 going from zero to a nominal value. Nominal value refers to a maximum value of the signal for which the cell's operation is guaranteed. Of course, the direction of the variation can indifferently be from zero to a nominal value, or vice versa.

Said current variation 73 is preferably periodic and has a sinusoidal, or triangular, shape. The frequency is preferably in the low frequency range, for example, between several millihertz and several hertz, to be as close as possible to a quasi-static load.

The amplitude varies substantially between a null value and the value of the nominal current.

Through this excitation category, it is possible to obtain automatic drawing of the voltage/current polarization curve of the fuel cell inasmuch as the frequency is low.

Figure 2B:
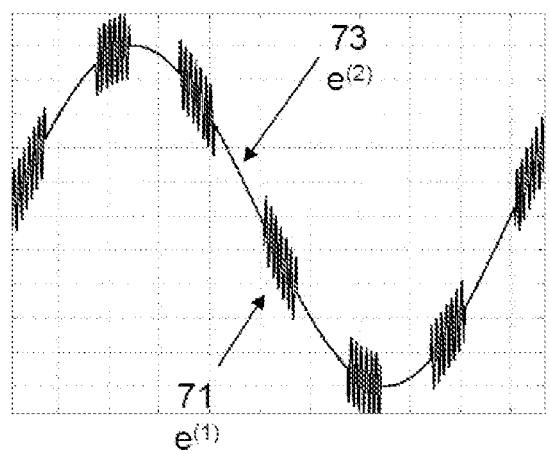
FIG. 2B is an enlarged portion of the signal shown in FIG. 2A and included in the box in broken lines.

FIGS. 2A and 2B show an example of an input signal comprising said first category and second category excitations. FIG. 2B is an enlarged part of the signal of FIG. 2A in the box in broken lines.

To obtain an input signal comprising maximum electrical excitations in a minimum amount of time, the electrical excitations $e^{(1)}$ are temporally superimposed on the excitations $e^{(2)}$.

The output signal S(t) is measured 20 by the measuring device. Said signal S(t) comprises the response signals corresponding to each applied electrical excitation.

The signal is processed to extract 30, from the output signal S(t), the response signals $s^{(1)}$ and $s^{(2)}$ corresponding to the respective electrical excitations.

A first estimating step 41 is implemented, which makes it possible to obtain the value of a first parameter characterizing the cell from the electrical excitation $e^{(1)}$ and the corresponding response signal $s^{(1)}$.

An impedance analysis device gives the complex impedance of the cell for the scanned series of frequencies. The evolution of the imaginary part of the impedance as a function of the real part can be drawn in a Nyquist plane.

It should be noted that, in the case where the input signal is the voltage at the terminals of the cells, the impedance analysis device deduces the complex admittance of the cell, and no longer the complex impedance. The impedance can nevertheless easily be deduced from the admittance.

The experimental data is then compared to a small signal dynamic model of the equivalent electrical circuit type at least partially characterizing the physicochemical behavior of the cell. The model used can be that described before in reference to the first method for estimating parameters according to the prior art.

The parameters of the model, including said first parameter, are estimated using a traditional optimization method, for example the least squares method.

In the case of the model previously described in reference to the prior art, the parameters can be the resistance of the membrane $R_{mem}$, which can be likened to the internal electrical resistance of the cell, the diffusion resistance $R_{diff}$ and the activation resistance $R_{act}$, as well as the double layer capacity $C_{dc}$ and the capacity of the equivalent diffusion layer $C_{diff}$.

Preferably, said first parameter is the internal electrical resistance of the fuel cell.

It should be noted that certain parameters can be determined without using a fuel cell equivalent electrical circuit-type model.

In fact, the intersection of the evolution of the impedance with the axis of the real numbers towards the high frequencies defines the value of the electrical resistance primarily due to the ohmic drop in the membrane of the cell. It is then possible to deduce therefrom the hydration level of the membrane, and thus to quickly detect the drainage phenomena of the membrane, which are particularly harmful phenomena for the structure of the membrane and the performance of the cell.

Following the first estimating step, a second estimating step 43 is done to estimate a physicochemical parameter characterizing the cell from an electrical excitation belonging to a second category $e^{(2)}$, the corresponding response signal $s^{(2)}$ and said first parameter previously estimated.

It will be recalled that, according to the first preferred embodiment of the invention, an electrical excitation of the second category is a current variation going from zero to a nominal value 73.

From the measured signals, one expresses the voltage as a function of the applied current.

If a hysteresis appears, one averages the values to obtain a bijective relationship between the voltage and the current.

The experimental data is then compared to a static fuel cell model in which the voltage is expressed as a function of the current.

The static model can be that previously described in reference to the third method for estimating parameters according to the prior art.

The parameters of the model are estimated using a traditional optimization method, for example the least squares method.

These parameters can be, in the case of the static model previously described, $\alpha^*$ and $I^*_0$, parameters relative to the activation over-voltages, $R_{mem}$, the electrical resistance of the cell, and $R_{diff, 0}$ a resistance related to losses by diffusion, and in particular to the diffusion over-voltages.

However, unlike the first estimating step 41 that estimates the first parameter only from experimental data, the second estimating step 43 uses not only the experimental data, but also the previously estimated value of said first parameter.

Concerning the use of the estimate of the first parameter by the second estimating step 43, a first situation arises if the first parameter is different from the physicochemical parameter, for example if the first parameter is the internal electrical resistance of the cell and the physicochemical parameter is one of said parameters relative to the activation or diffusion phenomena.

In that case, the optimization procedure is initiated by imposing, on the parameter of the static model identical to said first parameter, the estimated value of the first parameter, and on the other parameters, including said physicochemical parameter, a random initial value.

The imposed value can then be considered a fixed value, in which case the number of parameters of the static model to be estimated is lower. The second estimating step 43 is thus faster due to the smaller number of parameters to be estimated.

Alternatively, the imposed value can be considered an initial value. As a result, the second estimating step 43 will also estimate said parameter. However, the convergence time towards the final value is particularly short inasmuch as the initial value, estimated by the first step and therefore close to the actual value, is close to the final value.

A second situation, concerning the use of the estimate of the first parameter by the second estimating step 43, corresponds to the case where the first parameter and the physicochemical parameter are identical. For example, it involves the internal electrical resistance of the cell, or the diffusion resistance.

In that case, the optimization procedure is initiated by imposing, on the physicochemical parameter, the value estimated during the first estimating step 41.

The imposed value can then be considered an initial value. As a result, the second estimating step 43 will also estimate said parameter. However, in the same manner as before, the convergence time towards the final value is particularly short.

In any case, aside from the increased speed of the second estimating step, the latter is made more robust, i.e. the likelihood of obtaining incoherent values is reduced. It should be noted that the robustness, in general, decreases when the number of parameters to be determined increases. The robustness is also improved when the initial values are particularly close to the actual values.

Then, one calculates 50 a deviation between the estimated value of the physicochemical parameter and a predetermined reference value of the same parameter, said deviation characterizing said state of health of the cell.

It should be noted that it is possible to calculate other deviations from parameter values estimated during the first and/or second estimating step(s), and predetermined reference values for the same parameters. These additional deviations also characterize said state of health.

As an illustration, the state of health can be estimated as the deviation between the estimated value of the electrical resistance of the cell and a reference value of said resistance on the one hand, and as the deviation between the estimated value of a parameter relative to the diffusion or activation phenomena and a predetermined reference value of the same parameter, on the other hand.

According to a first alternative of the first preferred embodiment of the invention, the first category electrical excitation is no longer a sequence of sinusoidal perturbations, but a current step 72.

Step refers to the ideally instantaneous transition from an initial value to a different final value. The current interruption is an example of a commonly used step.

The second category electrical excitation remains identical to that previously described.

Figure 3:
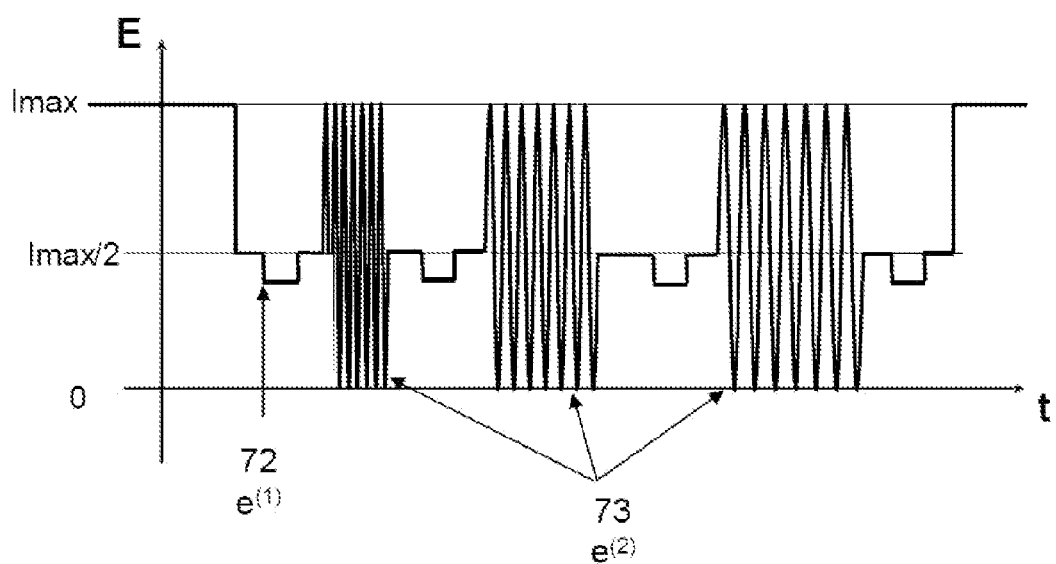
FIG. 3 is an example of an input signal comprising the first category and second category excitations, for the first alternative of the first preferred embodiment of the invention.

FIG. 3 shows an example of an input signal comprising said first and second category excitations, for this alternative of the first preferred embodiment of the invention.

At least one current step 72 is arranged between two second category electrical excitations. Thus, the first category and second category excitations are applied sequentially.

After the step for extracting response signals $s^{(1)}$ and $s^{(2)}$ corresponding to the excitations $e^{(1)}$ and $e^{(2)}$, step identical to that previously described, the first estimating step 41 for the first parameter is implemented.

The experimental results are analyzed with the aim of preferably determining the internal electrical resistance of the cell.

According to a procedure known by those skilled in the art, one measures the effective current step $\Delta I$, as well as the voltage jump $\Delta U$ in response, and one deduces therefrom the value of the internal resistance Re, for example by directly calculating the ratio $\Delta U/\Delta I$ at the moment (ideally) of application of the step.

Alternatively, and also in a known manner, it is possible to obtain the internal resistance from the temporal derivative of the voltage and the current. The internal resistance is then obtained from the relationship:

$$Re = \frac{\max|\partial_t u|}{\max|\partial_t i|}$$

Lastly, another procedure for obtaining the internal resistance is preferably used.

One defines $t_0$ as the application moment of the current step.

The current variation $\Delta I$ is calculated by subtracting, from the value of the current as a function of time, the value of the current before the step. The same calculation is done for the voltage. One thus has $\Delta I(t)=I(t)-I_{init}$ and $\Delta U(t)=U(t)-U_{init}$.

The instantaneous Impedance vector is then calculated from the current and voltage Variation vectors: $Z(t)=\Delta U(t)/\Delta I(t)$.

The instant $t_1$ is detected strictly greater than $t_0$ for which the impedance $Z(t)$ passes through a minimum.

Then, for $t \geq t_1$, $Z(t)$ is approximated by a numerical function, for example a polynomial of degree n.

Lastly, the internal electrical resistance of the cell corresponds to the value of said numerical function for $t=t_0$.

This procedure has the advantage of being completely automatable. An operator intervention to select a value is therefore not necessary. This procedure proves to be particularly precise and robust. Thus, it was possible to show that the relative error was below 0.5% relative to an impedance spectroscopy measurement immediately preceding the step.

Then the second estimating step 43 is done, which makes it possible to estimate the physicochemical parameter, of the corresponding response signal, and the first parameter previously estimated, here the internal resistance. This second step is identical or similar to that previously described, and is therefore not described again here. Here, the physicochemical parameter can be the internal electrical resistance or a parameter relative to the activation or diffusion phenomenon.

One then calculates 50 a deviation between the estimated value of the physicochemical parameter and a predetermined reference value of the same parameter, this deviation characterizing said state of health of the cell.

As previously mentioned, it is possible to calculate other deviations from the parameter values estimated during the first and/or second estimating step(s), and predetermined reference values for the same parameters. These additional deviations also characterize said state of health.

In a second alternative of the first preferred embodiment of the invention, the method is similar to that previously described, with the exception that the first category excitation is a current step 72 and the second category excitation is a sequence of sinusoidal current or voltage perturbations 71, around a polarization point of said electrochemical device, each perturbation having a different frequency, so as to travel through a determined series of frequencies.

These different excitations are identical or similar to those previously described.

Figure 4:
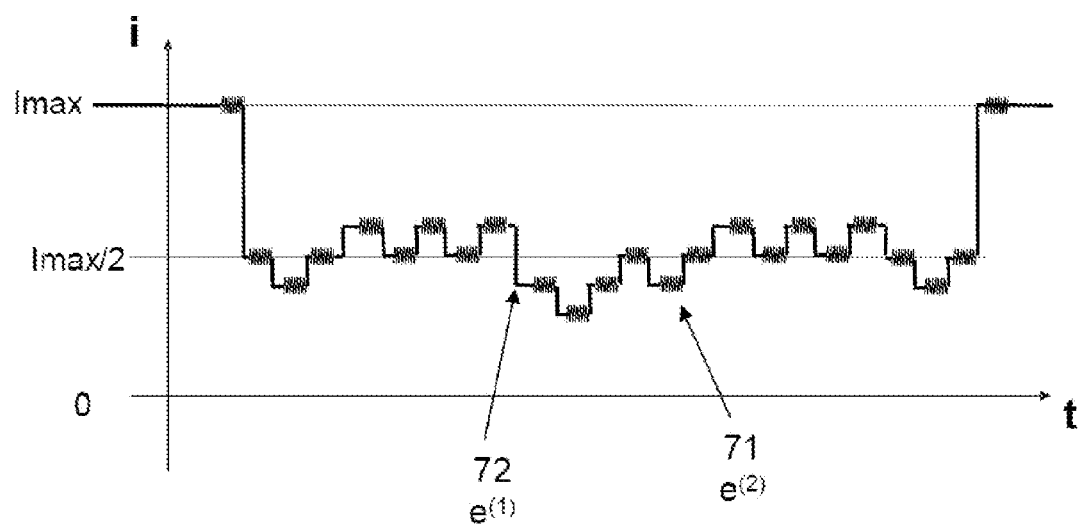
FIG. 4 is an example of an input signal comprising the first category and second category excitations, for the second alternative of the first preferred embodiment of the invention.

FIG. 4 is an example of an input signal comprising said first and second category excitations, for said second alternative of the first preferred embodiment of the invention.

At least one current step 72 is arranged between two sinusoidal perturbations 71. Thus, the first and second category excitations are applied sequentially.

After the step for extracting response signals $s^{(1)}$ and $s^{(2)}$ corresponding to the excitations $e^{(1)}$ and $e^{(2)}$, step identical to the one previously described, the first estimating step 41 of the first parameter is implemented.

The latter is identical to that described in the first alternative of the first embodiment of the invention, and is therefore not described again here. The first parameter is preferably the internal electrical resistance of the fuel cell.

The second estimating step 43 is then implemented, similar to that described for the first embodiment of the invention, with the exception that the first physicochemical parameter is estimated in particular from the first parameter.

The experimental data is compared to a small signal dynamic model of the equivalent electrical circuit type at least partially characterizing the physicochemical behavior of the cell.

The parameters of the model, including said first parameter, are estimated using a traditional optimization procedure, for example of least squares.

Concerning the use of the estimation of the first parameter by the second estimating step, the two situations previously described concerning the identity of the first and second parameters are found again here.

One then calculates 50 a deviation between the estimated value of the physicochemical parameter and a predetermined reference value of the same parameter, this deviation characterizing said state of health of the cell.

As previously mentioned, it is possible to calculate other deviations from the parameter values estimated during the first and/or second estimating steps, and predetermined reference values for the same parameters. These additional deviations also characterize said state of health.

Figure 5:
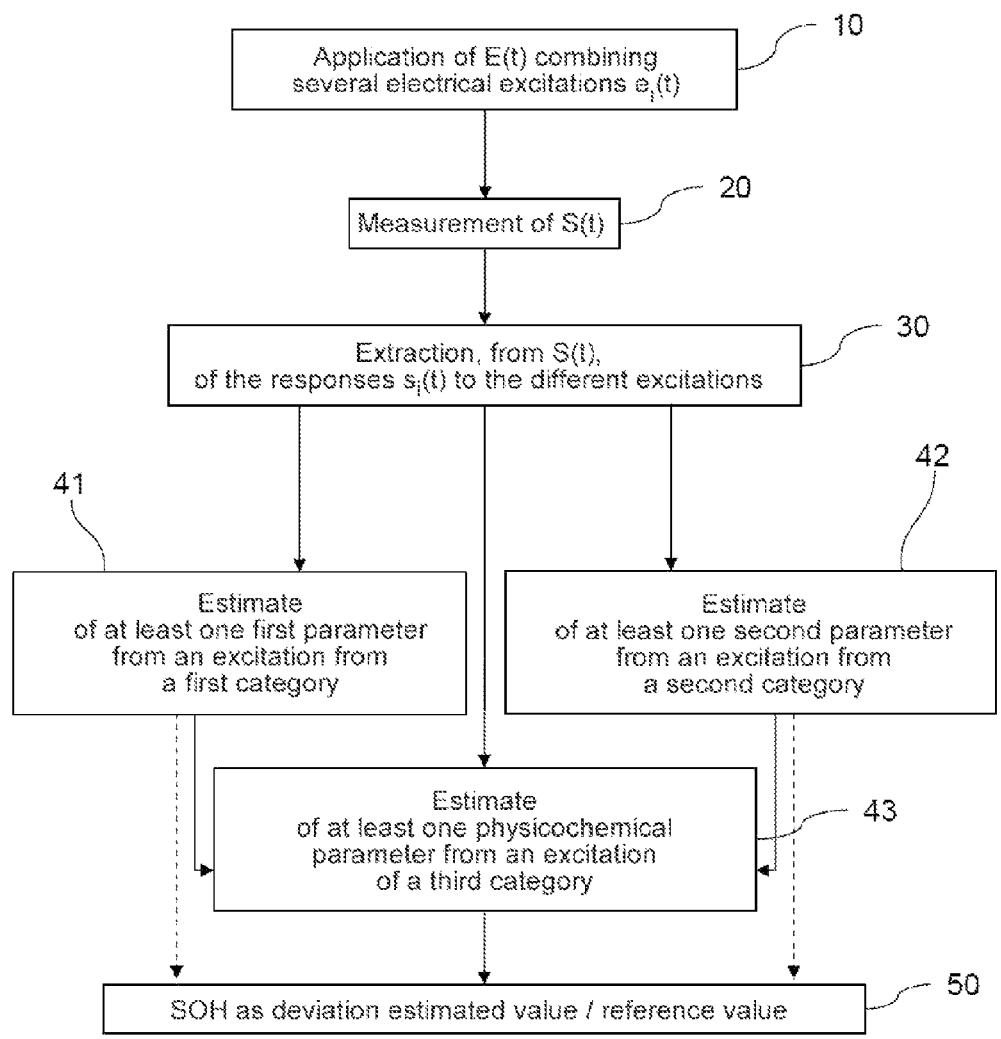
FIG. 5 is a flowchart of the diagnostic method according to a second preferred embodiment of the invention, in which two steps for estimating parameters are carried out simultaneously and preceding the step for estimating the third parameter.

A second preferred embodiment of the invention is now described in detail, in reference to FIG. 5, in which the input signal comprises at least three excitations of different categories.

The excitation categories are similar or identical to the three categories described before.

According to the second preferred embodiment, a first category excitation is a current step 72. A second category excitation is a sequence of sinusoidal current perturbations 71, around a polarization point of said electrochemical device, each frequency having a different frequency, so as to travel through a particular series of frequencies. And a third category excitation is a current variation, in low frequencies, between zero and a nominal value 73.

Figure 6:
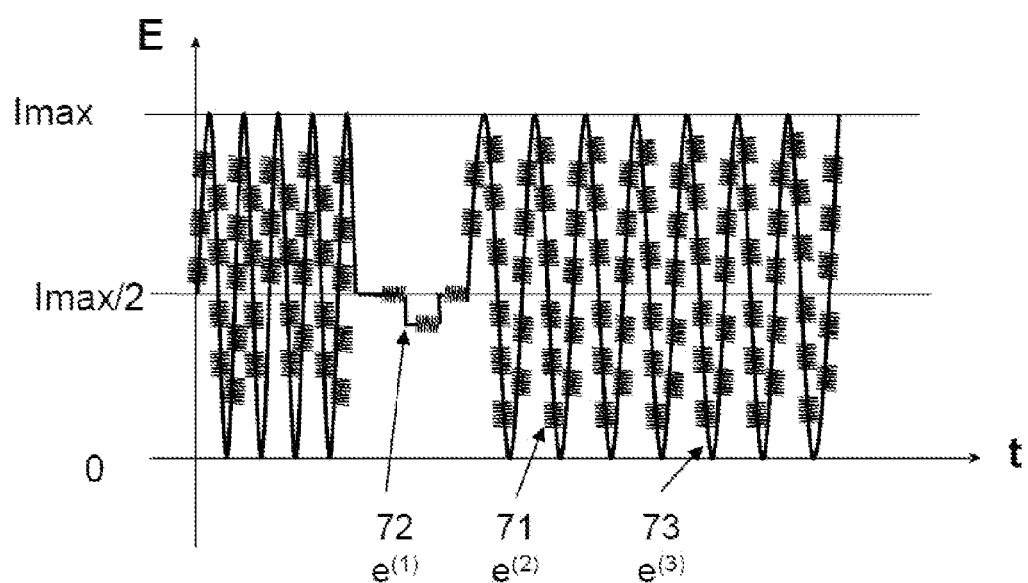
FIG. 6 is an example of an input signal comprising said first, second and third category excitations, for the second preferred embodiment of the invention.

FIG. 6 is an example of an input signal comprising said first, second and third category excitations, for this second preferred embodiment of the invention.

At least one current step 72 is arranged between two sinusoidal perturbations 71. Thus, the first and second category excitations are applied sequentially.

To obtain an input signal comprising maximum electrical excitations in minimum time, the second category electrical excitations are temporally superimposed, at least in part, on the third category excitations.

The method comprises a second estimating step 42 done before the step 43 for estimating the physicochemical parameter. This second step 42 consists of estimating a second parameter from an electrical excitation belonging to a second category and the corresponding response signal.

According to this embodiment, the physicochemical parameter is then estimated from said first parameter and said second parameter.

After the step for extracting response signals $s^{(1)}$, $s^{(2)}$ and $s^{(3)}$ corresponding to the excitations $e^{(1)}$, $e^{(2)}$ and $e^{(3)}$, step substantially identical to that described before, the first step for estimating the first parameter is implemented.

The first estimating step 41 is identical to that described in the first alternative of the first embodiment of the invention.

The second estimating step 42 is preferably carried out at the same time as the first estimating step. It is identical to the one described in the first embodiment of the invention, in which it then corresponded to the first estimating step.

Then, the third estimating step 43 is implemented for estimating the physicochemical parameter from a third category excitation, the corresponding response signal and said first and second previously estimated parameters.

One then calculates 50 a deviation between the estimated value of the physicochemical parameter and a predetermined reference of the same parameter, said deviation characterizing said state of health of the cell.

As previously mentioned, it is possible to calculate other deviations from parameter values estimated during the first and/or second and/or third estimating step(s), and predetermined reference values for the same parameters. These additional deviations also characterize said state of health.

Thus, the physicochemical parameter is estimated more precisely. The method is thus made more precise and more robust.

As in the first preferred embodiment, or as in the first alternative of the first embodiment, the first parameter is preferably the internal electrical resistance of the cell.

The second parameter can be the internal electrical resistance, or one of the parameters relative to the voltage drops due to activation or diffusion phenomena, for example the diffusion resistance.

The physicochemical parameter can be the internal electrical resistance, or one of the parameters relative to the voltage drops due to the activation or diffusion phenomena, for example the diffusion resistance.

Figure 7:
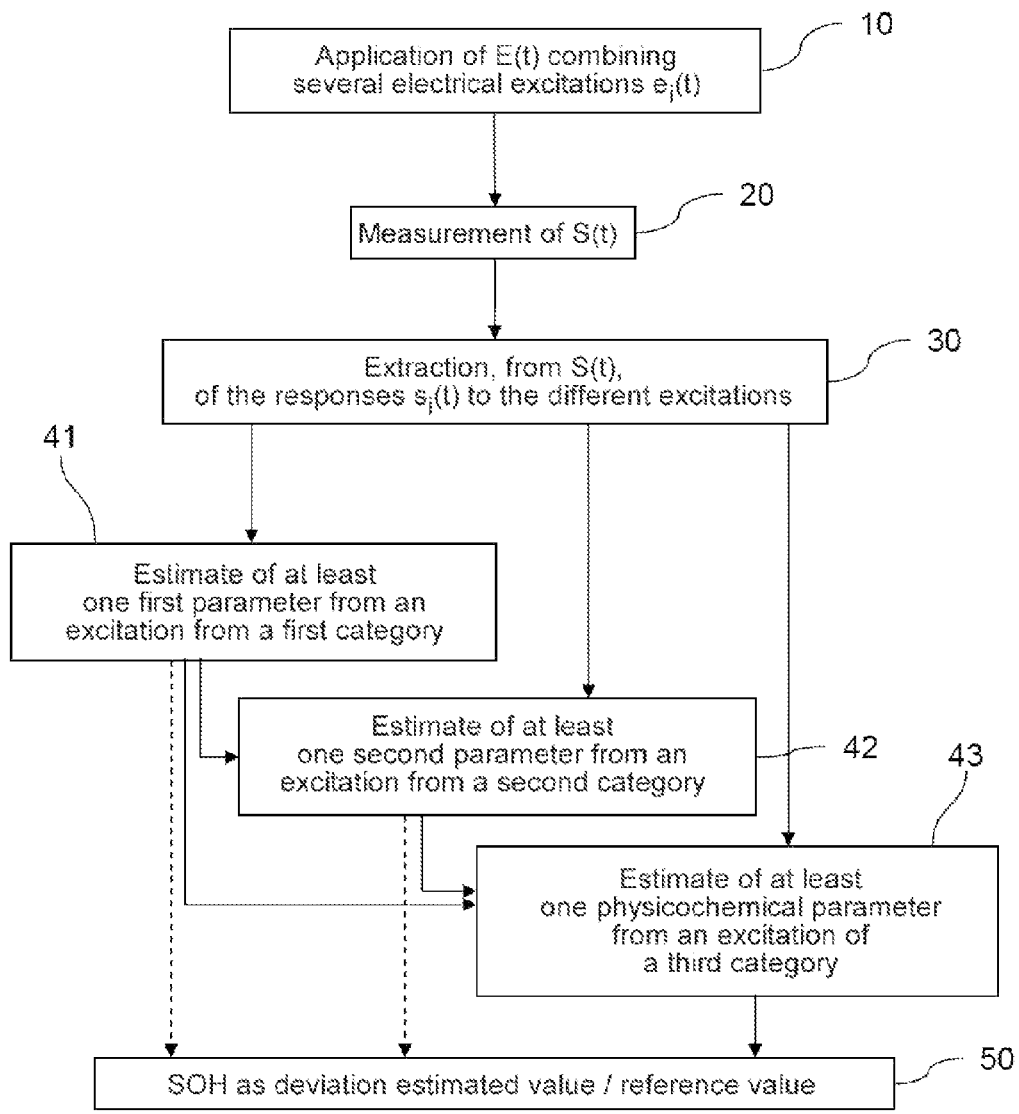
FIG. 7 is a flowchart of the diagnostic method according to a third preferred embodiment of the invention, in which a step for estimating at least one second parameter is done between the step for estimating at least one first parameter and the step for estimating at least one third parameter.

A third preferred embodiment of the invention is now described, in reference to FIG. 7, in which the input signal comprises at least three excitations of different categories.

This third embodiment is substantially identical to the second embodiment that has just been described.

However, the second estimating step 42 is not done at the same time as the first step 41, but after it. Moreover, the second step estimates the second parameter, in particular from the first parameter previously estimated.

Thus, the second parameter is estimated with increased precision. The estimate of the physicochemical parameter benefits directly from this greater precision. The method is thus made more precise and more robust.

As previously described, the method can comprise an electrical excitation of the sequence of sinusoidal current perturbations 71 type, around a polarization point of said electrochemical device, each perturbation having a different frequency, belonging to a main series of frequencies.

The polarization point preferably remains constant over the entire application length of the sequence of perturbations.

Each perturbation preferably comprises several periods so that any transient state is damped, then several periods to calculate the impedance.

Each perturbation has a different frequency, such that the perturbation sequence scans a primary series A of frequencies $A=\{f_1, f_2, \ldots, f_N\}$. More precisely, the series of perturbations includes at least one perturbation for each frequency of the series A.

The range of the primary series A of frequencies can go from several millihertz to several tens of kilohertz, and comprises N frequencies to be scanned, for example, around one hundred frequencies.

The amplitude of the perturbations is low enough for the cell's response to remain linear. To that end, the amplitude is substantially below 10% of the value of the current at the considered operating point, and is preferably in the vicinity of a percent of said value.

An impedance analysis device gives the complex impedance of the cell for each of the frequencies of the primary series A. It is then possible to trace the evolution of the imaginary part of the impedance as a function of the real part in a Nyquist plane.

It should be noted that, in the case where the input signal is the voltage at the terminals of the cell, the impedance analysis device deduces the complex admittance of the cell, and no longer the complex impedance. The impedance can nevertheless be easily deduced from the admittance.

The frequencies of said primary series A are distributed so as to form a plurality of sub-series $A^1, \ldots, A^n$ of frequencies.

Sub-series $(A^i)_{i=1\ldots n}$ of frequencies refers to a set of frequencies extracted, or resulting, from the primary series A:

$$A^1 = \{f_j^i / f_j^i \in A\}$$

The union of the sub-series $(A^i)_{i=1\ldots n}$ corresponds to the primary series A of frequencies:

$$A = \bigcup_{i=1}^{n} A^i$$

Preferably, each sub-series does not contain frequencies shared with another sub-series:

$$\bigcap_{i=1}^{n} A^i = \emptyset$$

Preferably, each sub-series $(A^i)_{i=1\ldots n}$ of frequencies includes $N^i$ frequencies, so that the sum of the $N^i$ frequencies equals the number N of frequencies of the primary series A:

$$\sum_{i=1}^{n} N^i = N$$

Each sub-series $A^i$ has a range of frequencies. Range $G^i$ of the sub-series $A^i$ refers to the set of frequencies of the sub-series considered to be comprised between the highest frequency and the lowest frequency of said sub-series. Thus:

$$G^i = \{f_j^i / \forall j \in [1, N^i], f_{(min)}^i \leq f_j^i \leq f_{(max)}^i\}$$

with $$f_{(min)}^i = \min(A_i) f_{(max)}^i = \max(A_i)$$

Each sub-series $A^i$ of said plurality of sub-series is interlaced with at least one other sub-series $A^{i'}$ of the same plurality.

Interlacing of two sub-series $A^i$ and $A^{i'}$ refers to the presence of at least one frequency of a first sub-series between two consecutive frequencies of the second sub-series.

More precisely, there is interlacing between the sub-series $A^i$ and $A^{i'}$ such that $$A^i = \{f_j^{i}\}_{j \in [1, N^i]} \text{ and } A^{i'} = \{f_k^{i'}\}_{k \in [1, N^{i'}]}$$

if:

$$\exists j_0 / f_k^{i'} \leq f_{j_0}^i \leq f_{k+1}^{i'}$$

or if:

$$\exists k_0 / f_j^i \leq f_{k_0}^{i'} \leq f_{j+1}^i$$

In a first alternative, each sub-series is interlaced with all of the other sub-series of said plurality.

Each sub-series is traveled through by the sequence of perturbations monotonously, in the same direction, preferably from the high frequencies toward the low frequencies.

Moreover, said plurality of sub-series of frequencies is traveled through monotonously. Monotonous order means that the plurality of sub-series of frequencies is traveled through from sub-series to adjacent sub-series, following an ordered ranking of the sub-series. Preferably, said sub-series are ranked according to decreasing order of the maximum frequency of each sub-series.

Figure 8A:
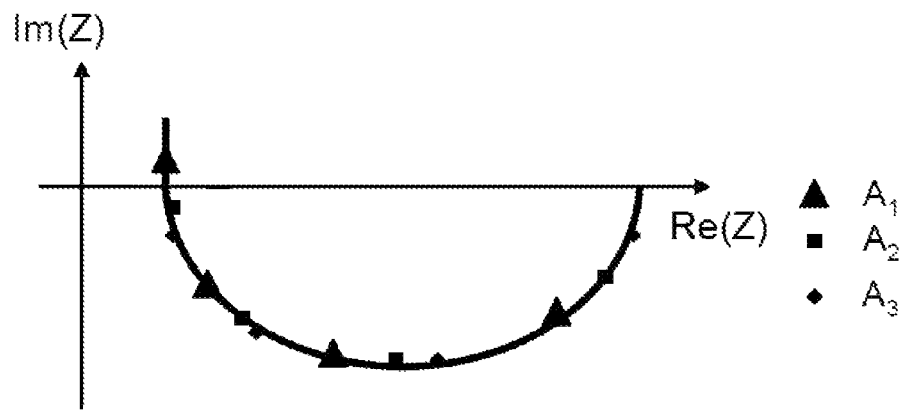
FIGS. 8A and 8B are graphs showing the evolution of the impedance as a function of the applied perturbations, in case of stability (FIG. 8A) and instability (FIG. 8B) of the electrical system.
Figure 8B:
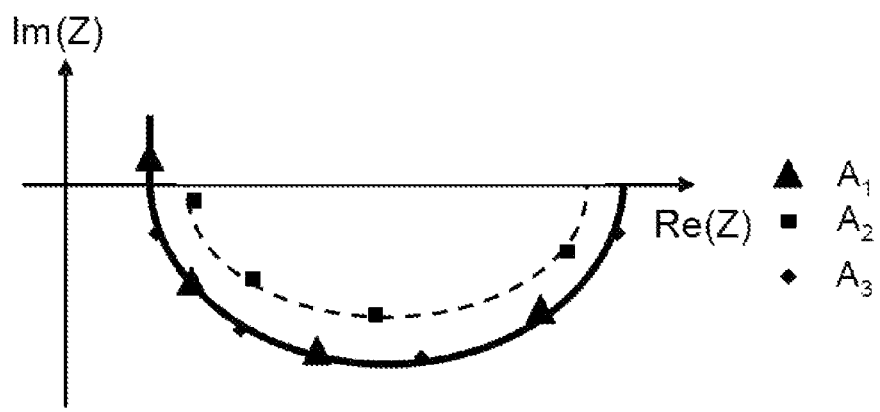

As an example, and as illustrated by FIGS. 8A and 8B, the primary series A of frequencies to be scanned is from 2 Hz to 10 kHz, and includes 12 frequencies. Thus, the series A is: A={10 kHz, 5 kHz, 2 kHz, 1 kHz, 500 Hz, 200 Hz, 100 Hz, 50 Hz, 20 Hz, 10 Hz, 5 Hz, 2 Hz}.

Three sub-series $A^1$, $A^2$, $A^3$ are formed from the primary series A by decimation of one out of three frequencies:

$A^1$={10 kHz, 1 kHz, 100 Hz, 10 Hz}
$A^2$={5 kHz, 500 Hz, 50 Hz, 5 Hz}
$A^3$={2 kHz, 200 Hz, 20 Hz, 2 Hz}

According to this alternative, each sub-series of frequencies has at least one frequency comprised between two consecutive frequencies of another sub-series. There is therefore interlacing between each of the three sub-series, and not only between two adjacent sub-series.

Thus, instead of applying the sequence of perturbations so as to continuously scan the N frequencies of the primary series A, as in the traditional solution of the prior art described before, the sequence of perturbations travels turn by turn through the three sub-series of frequencies.

The sequence of perturbations preferably travels successively through the frequencies of sub-series $A^1$, then those of sub-series $A^2$, etc.

Thus, by interlacing said sub-series, the method makes it possible to know quickly whether the sub-system has remained stable throughout the duration of the measurements.

In fact, in case of instability of the fuel cell, upon application of the sub-series $A^i$, the experimental points of the impedance for the frequencies of said sub-series are not situated in the continuation of the points corresponding to the impedance measured for the preceding sub-series $A^{i-1}$.

For example, as illustrated by FIGS. 8A and 8B, the application of the perturbations scanning the sub-series $A^1$ makes it possible to obtain the values of the impedance $Z(A^1)$ for the considered frequencies: Z(10 kHz), Z(1 kHz), Z(100 Hz) . . . .

The values of the impedance $Z(A^2)$ for the frequencies of the sub-series $A^2$ should, if the cell has stayed stable throughout the measuring time, be placed in the continuation of those of $Z(A^1)$. As shown by FIG. 8A (stable cell), the values of the impedance for each sub-series of frequencies is placed continuously along a given curve (solid line).

If the cell becomes unstable between sub-series $A^1$ and $A^2$, a discontinuity appears between $Z(A^1)$ and $Z(A^2)$ in the overlap area between the ranges of these two sub-series. FIG. 8B illustrates this discontinuity. The values of $Z(A^2)$ are placed on a curve (broken line) different from that of $Z(A^1)$ (solid line). The discontinuity appears as of the first value of $Z(A^2)$ corresponding to the first applied frequency of the sub-series $A^2$.

It is possible to simply evaluate the discontinuity in the considered overlap area. Thus, a first frequency of a first sub-series $A^1$ is situated between two consecutive frequencies $f^2_j$ and $f^2_{j+1}$ of a second sub-series $A^1$ and $A^2$ are therefore interlaced.

One then calculates a value of the impedance for the first frequency $Z_{int}(f^1_i)$ from impedances corresponding to the two frequencies $Z(f^2_j)$ and $Z(f^2_{j+1})$ of the second sub-series. This calculation can be done, for example, by linear, cubic (by cubic spline) or polynomial interpolation.

One then calculates a deviation between the estimated value of the impedance for a first frequency $Z(f^1_i)$ and the value of the impedance obtained by interpolation $Z_{int}(f^1_i)$.

One lastly compares the calculated deviation with a predetermined threshold deviation. When this deviation exceeds the threshold deviation, an instability of the fuel cell is deduced therefrom.

Thus, the sequence of perturbations makes it possible to know quickly whether the system has remained stable throughout the duration of the measurements.

Moreover, again soliciting the high frequencies, here at the beginning of each sub-series, makes it possible to identify any rapid physical phenomena all throughout the measurement.

Of course, this example is only provided as an illustration. It is possible to increase or decrease the number of sub-series, and therefore to respectively decrease or increase the number of frequencies in each sub-series.

For example, for a primary series A including 400 frequencies, the sequence of perturbations can travel through approximately twenty sub-series of frequencies each including approximately twenty frequencies.

According to a second alternative, each sub-series $A^i$ of frequencies is only interlaced with the adjacent sub-series $A^{i-1}$ and $A^{i+1}$. With the exception of this difference, the second embodiment remains similar to the first embodiment.

As an example, for the following primary series A={10 kHz, 5 kHz, 2 kHz, 1 kHz, 500 Hz, 200 Hz, 100 Hz, 50 Hz, 20 Hz, 10 Hz, 5 Hz, 2 Hz}, the sub-series can be:

$A^1$={10 kHz, 2 kHz}
$A^2$={5 kHz, 500 Hz}
$A^3$={1 kHz, 100 Hz}
$A^4$={200 Hz, 20 Hz}
$A^5$={50 Hz, 5 Hz}
$A^6$={10 Hz, 2 Hz}

The sequence of perturbations scans the sub-series turn by turn, following the decreasing order of the maximum frequencies.

Thus, the sequence of perturbations has a movement presenting a succession of back and forth movements, while going gradually from the high frequencies towards the low-frequencies.

As previously described, in case of instability of the cell, a discontinuity in the values of the impedance appears at the overlap areas between the adjacent sub-series.

This discontinuity can be exploited to diagnose a budding defect, such as for example drainage or engorgement of a fuel cell, and to lead to retroaction on the control-command of the fuel cell.

For the different alternatives described earlier, the frequencies of each sub-series $A^i$ can be scanned no longer monotonously, but randomly, by said sequence of perturbations.

Likewise, said plurality of sub-series of frequencies $A^1, \ldots, A^n$ can be traveled through randomly by said sequence of perturbations.

It should be noted that interlaced spectroscopy, irrespective of the alternatives previously described, has a result identical, when the cell remains stable, to that of traditional spectroscopy.

Now described is an alternative of a step for estimating a parameter from an electrical excitation of the current variation type going from zero to a nominal value.

As described in the first preferred embodiment, the measured experimental data is compared to a static fuel cell mode in which the voltage is expressed as a function of the current. The parameters of the model are estimated using a traditional optimization procedure, for example of least squares.

To improve the reliability of the results, it is possible to compare no longer only the experimental curve $U_{exp}=f(I_{exp})$ to the curve of the static model $U_{th}=f(I_{th})$, but that same experimental curve and its successive derivatives $\partial_I U_{exp}$, $\partial_{II} U_{exp} \ldots$ to the model curve and its successive derivatives $\partial_I U_{th}, \partial_{II} U_{th} \ldots$, respectively.

Thus, the optimization procedure minimizes the deviation between the system of equations resulting from the experimental data and the system of equations resulting from the static model.

Inasmuch as the number of unknowns remains the same while the number of equations is increased, the likelihood of obtaining incoherent results is greatly decreased, which substantially improves the reliability of the method.

It should be noted that the embodiments of the invention previously described remain similar in the event the input signal applied to the fuel cell is the voltage at the terminals thereof.

Lastly, the invention also relates to a method for controlling an electrochemical device including:
 determining a state of health according to any one of the preceding characteristics; then
 applying a command to said electrochemical device when said deviation exceeds a predetermined threshold deviation.

Thus, when the determined state of health indicates the drainage of the membrane of a cell, applying a command to the cell in particular makes it possible to prevent the drainage from lasting and deteriorating the membrane.

The invention claimed is:

1. A method for determining a state of health of an electrochemical device from at least one physicochemical parameter at least partially modeling the physicochemical behavior of said electrochemical device, said method being characterized in that it includes the following steps:
 applying (10) to said electrochemical device an input signal comprising a plurality of electrical excitations, each excitation belonging to a particular excitation category chosen from amongst a set formed by a sequence of sinusoidal current or voltage perturbations, around a polarization point of said electrochemical device, each perturbation having a different frequency, so as to travel through a particular series of frequencies; a current or voltage step; and a current or voltage variation going from zero to a nominal value, said input signal comprising at least two excitations of different categories, and measuring an output signal (20) of said electrochemical device in response to said input signal; then
 extracting (30), from said output signal, the response signals associated with each of said electrical excitation signals; then
 estimating (41) at least one first parameter from an electrical excitation belonging to a first category and the corresponding response signal;
 estimating (43) said at least one physicochemical parameter from an electrical excitation belonging to a category different from the first, of the corresponding response signal and at least the first estimated parameter;
 estimating (50) said state of health of the electrochemical device as deviation between the previously estimated value of said at least one physicochemical parameter and a predetermined reference value.

2. The method according to claim 1, characterized in that said first category electrical excitation and said electrical excitation of a category different from the first category are applied sequentially.

3. The method according to claim 1, characterized in that at least one first category electrical excitation is at least partially temporally superimposed on an electrical excitation of a category different from the first category.

4. The method according to claim 2, characterized in that the first category electrical excitation is a current or voltage step, and in that the electrical excitation of a category different from the first category is chosen from amongst a set formed by a sequence of sinusoidal current or voltage perturbations, around a polarization point of said electrochemical device, each perturbation having a different frequency, so as to travel through a particular series of frequencies, and a current or voltage variation going from zero to a nominal value.

5. The method according to claim 3, characterized in that the first category electrical excitation is a series of sinusoidal current or voltage perturbations, around a polarization point of said electrochemical device, each perturbation having a different frequency, so as to travel through a particular series of frequencies, and
in that said electrical excitation of a category different from the first category is a current or voltage variation going from zero to a nominal value.

6. The method according to any one of claims 1 to 5, characterized in that one estimates (50) said state of health, moreover, as a deviation between the estimated value of said at least one first parameter and a predetermined reference value.

7. The method according to any one of claims 1 to 3, characterized in that said input signal comprises at least three excitations of different categories, and
in that, before the step for estimating (43) said at least one physicochemical parameter, one estimates (42) at least one second parameter from an electrical excitation belonging to a second category different from the first category, of the corresponding response signal;
the estimation (43) of said at least one physicochemical parameter being done from an electrical excitation belonging to a third category different from the first category and the second category, of the corresponding response signal and said at least one first parameter and said at least one second parameter previously estimated.

8. The method according to claim 7, characterized in that said at least one second parameter is also estimated from said at least one first parameter.

9. The method according to claim 7 or 8, characterized in that the first category electrical excitation is a current or voltage step,
in that the second category electrical excitation is a sequence of sinusoidal current or voltage perturbations, around a polarization point of said electrochemical device, each perturbation having a different frequency, so as to travel through a particular series of frequencies, and
in that the third category electrical excitation is a current or voltage variation going from zero to a nominal value.

10. The method according to any one of claims 7 to 9, characterized in that one estimates (50) said state of health as, moreover, a deviation between the estimated value of said at least one first parameter and a predetermined reference value, and/or as a deviation between the estimated value of said at least one second parameter and a predetermined reference value.

11. The method according to any one of claims 1 to 10, characterized in that the input signal comprises a series of sinusoidal current or voltage perturbations, around a polarization point of said electrochemical device, each perturbation having a different frequency, and
in that said sequence of perturbations is applied so as to scan, turn by turn, a plurality of sub-series $(A_1, \ldots, A_n)$ of frequencies resulting from said primary series (A), each sub-series of said plurality being interlaced with at least one other sub-series of the same plurality.

12. The method according to claim 11, characterized in that each sub-series of said plurality is interlaced with all of the other sub-series of the same plurality.

13. The method according to claim 11 or 12, characterized in that the perturbations of said sequence are applied so as to monotonously scan the frequencies of each sub-series $(A_i)$.

14. The method according to claim 11 or 12, characterized in that the perturbations of said sequence are applied so as to randomly scan the frequencies of each sub-series $(A_i)$.

15. The method according to any one of claims 11 to 14, characterized in that the sub-series are ranked in a particular order, the perturbations of said sequence being applied so as to monotonously scan said sub-series $(A_1, \ldots, A_n)$ of said plurality.

16. The method according to any one of claims 11 to 14, characterized in that the sub-series are ranked in a particular order, the perturbations of said sequence being applied so as to randomly scan said sub-series $(A_1, \ldots, A_n)$ of said plurality.

17. The method according to any one of claims 1 to 16, characterized in that, one of said parameters being the internal electrical resistance of said electrochemical device, the estimation of said parameter from a current or voltage step, and the corresponding response signal, consists of:
subtracting, from said input signal and said corresponding response signal, their respective value preceding the application of said electrical excitation, to thus obtain the current variation and the voltage variation;
calculating the instantaneous impedance by dividing said voltage variation by said current variation, and detecting a moment $t_1$, greater than the moment $t_0$ of application of said electrical excitation, for which said instantaneous impedance has a minimum;
extrapolating said instantaneous impedance from the moment $t_1$, and projecting said extrapolation to moment $t_0$, to thereby deduce the value of the internal electrical resistance of said electrochemical device.

18. The method according to any one of claims 1 to 17, characterized in that an experimental evolution of the voltage as a function of the current being obtained from said input signal and said corresponding response signal, a model evolution of the voltage as a function of the current being parameterized by at least one of said parameters, the estimation of said parameter from a current or voltage variation going from zero to a nominal value is obtained by:
minimizing a characteristic size of the deviation existing between, on the one hand, said model evolution of the voltage and its N successive derivatives, and on the other hand, said experimental evolution of the voltage and its N successive derivatives.

19. The method according to any one of the preceding claims, characterized in that said electrochemical device is an electrolyzer or a fuel cell.

20. A method for controlling an electrochemical device, characterized in that it includes:
determining a state of health according to any one of the preceding characteristics; then
applying a command to said electrochemical device when said measured deviation exceeds a predetermined threshold deviation.

* * * * *

UNITED STATES PATENT AND TRADEMARK OFFICE
CERTIFICATE OF CORRECTION

PATENT NO. : 8,907,675 B2  
APPLICATION NO. : 13/202607  
DATED : December 9, 2014  
INVENTOR(S) : Vincent Phlippoteau et al.

Page 1 of 1

It is certified that error appears in the above-identified patent and that said Letters Patent is hereby corrected as shown below:

In the Specification,

Column 16, line 56, please insert -- $f^1_i$ -- between "frequency" and "of"

Signed and Sealed this
Sixteenth Day of June, 2015

Michelle K. Lee
*Director of the United States Patent and Trademark Office*